United States Patent
Todoroff et al.

(10) Patent No.: US 7,250,893 B2
(45) Date of Patent: Jul. 31, 2007

(54) SIGNAL PROCESSING CIRCUIT AND METHOD FOR USE WITH AN OPTICAL NAVIGATION SYSTEM

(75) Inventors: Brian D. Todoroff, San Jose, CA (US); Douglas A. Webb, Los Altos, CA (US)

(73) Assignee: Silicon Light Machines Corporation, San Jose, CA (US)

( * ) Notice: Subject to any disclaimer, the term of this patent is extended or adjusted under 35 U.S.C. 154(b) by 0 days.

(21) Appl. No.: 11/271,039

(22) Filed: Nov. 12, 2005

(65) Prior Publication Data

US 2006/0261994 A1 Nov. 23, 2006

Related U.S. Application Data

(60) Provisional application No. 60/681,682, filed on May 17, 2005.

(51) Int. Cl.
*H03M 1/12* (2006.01)
(52) U.S. Cl. .................. 341/155; 250/208.1; 348/241; 348/308
(58) Field of Classification Search ............... 345/163
See application file for complete search history.

(56) References Cited

U.S. PATENT DOCUMENTS

| | | | |
|---|---|---|---|
| 5,994,710 A * | 11/1999 | Knee et al. ............... 250/557 |
| 6,031,218 A | 2/2000 | Plot et al. | |
| 6,201,572 B1 * | 3/2001 | Chou ...................... 348/241 |
| 6,243,134 B1 * | 6/2001 | Beiley ..................... 348/308 |
| 6,424,407 B1 | 7/2002 | Kinrot et al. | |
| 6,585,158 B2 * | 7/2003 | Norskog ............... 235/462.13 |
| 6,753,851 B2 * | 6/2004 | Choi et al. ................ 345/166 |
| 6,795,056 B2 * | 9/2004 | Norskog et al. ........... 345/158 |
| 6,823,077 B2 * | 11/2004 | Dietz et al. .............. 382/107 |
| 2003/0071195 A1 * | 4/2003 | Misek ................... 250/208.2 |
| 2003/0227040 A1 * | 12/2003 | Henderson ............... 257/291 |
| 2004/0027470 A1 * | 2/2004 | Henderson et al. ......... 348/294 |
| 2004/0036785 A1 * | 2/2004 | Takayanagi ............... 348/308 |
| 2005/0285960 A1 * | 12/2005 | Purcell et al. ............. 348/308 |

* cited by examiner

*Primary Examiner*—Khai M. Nguyen
(74) *Attorney, Agent, or Firm*—William E. Nuttle

(57) ABSTRACT

A signal processing circuit and processing method are provided for measuring an analog signal from a photo-detector. Generally, the method includes steps of: (i) sampling and storing a characteristic of the signal at a first predetermined time following a reset of the circuit; (ii) sampling the characteristic of the signal at a second predetermined time following a reset or initialization of the circuit; (iii) determining a difference between the stored characteristic of the signal sampled at the first predetermined time and the characteristic of the signal sampled at the second predetermined time; and (iv) converting the determined difference to a digital value and determining a slope of the signal from the digital value and the difference between the first and second predetermined times. Thus, the measurement of the slope is independent of and substantially unaffected by absolute values of the characteristics measured at the first and second predetermined times.

20 Claims, 4 Drawing Sheets

SIGNAL PROCESSING CIRCUIT AND METHOD FOR USE WITH AN OPTICAL NAVIGATION SYSTEM

CROSS-REFERENCE TO RELATED APPLICATIONS

The present application claims the benefit of priority under 35 U.S.C. 119(e) to U.S. Provisional Patent Application Ser. No. 60/681,682, filed May 17, 2005 entitled A Circuit and Method for Measuring Signal Slope in an Analog Front-end of Digital Signal Processing Circuit; which application is hereby incorporated by reference.

TECHNICAL FIELD

The present invention relates generally to signal processing, and more particularly to a signal processing method for use with an optical navigation system to determining motion without sinusoidal signals.

BACKGROUND OF THE INVENTION

Signal processors are used in a wide range of applications including, for example, measuring a current output from a photo-detector of an array in an optical navigation system. Optical navigation systems, such as an optical computer mouse or trackball, are well known for inputting data into and interfacing with personal computers and workstations. Such devices allow rapid relocation of a cursor on a monitor, and are useful in many text, database and graphical programs. A user controls the cursor, for example, by moving the mouse over a surface to move the cursor in a direction and over distance proportional to the movement of the mouse. Alternatively, movement of the hand over a stationary device may be used for the same purpose.

One embodiment of an optical computer mouse uses a coherent light source, such as a laser, to illuminate a rough surface, and an array of a number of photo-sensors or detectors, such as photodiodes, to receive light scattered from the surface. Light from the coherent source scattered off of the surface generates a random intensity distribution of light known as speckle. The varying intensity of scattered light detected by the photo sensors in the array as the mouse is moved across the surface is used to detect movement of the mouse.

Although a significant improvement over prior art computer mice, these speckle-based devices have not been wholly satisfactory for a number of reasons. In particular, processing signals from the photodiodes involves measuring the photocurrent output through a transimpedance amplifier (TIA). The TIA converts photocurrent to voltage by producing a voltage output with a slope proportional to the photocurrent. A signal trace illustrating an output from a TIA in a conventional signal processing circuit is shown in FIG. 1. Referring to FIG. 1, the TIA output is reset at the beginning of each sampling period ($T_1$) and then allowed to ramp up for a fixed amount of time. At the end of the ramp time ($T_2$) the voltage output is sampled and converted to a digital value in an analog-to-digital converter (ADC) and the next sampling period begins. In theory the TIA output should be reset to exactly the same voltage at the beginning of each sampling period. In reality there is a variation in the voltage after reset referred to as reset noise 101. Because the digital value is derived from the actual output voltage at the end of the ramp, this reset noise shows up as noise in the digital value measured, reducing the accuracy of measurement and the performance of the optical mouse.

One technique for dealing with the above reset noise problem is to measure a digital value at the beginning of the ramp just after reset and then subtract this from the digital value measured at the end of the sampling period, thereby limiting the effects of the reset noise on the slope measurement. However, this increase in accuracy is accomplished at the expense of requiring twice as many analog to digital conversions, and hence doubling the sampling rate required of the ADCs, and additional digital circuitry to store the starting value and do the subtraction.

Accordingly, there is a need for a signal processor or circuit and processing method to measure a slope of an analog signal, that is substantially independent of and unaffected by absolute values of the measured characteristics of the signal. It is desirable that the circuit and method achieve this end without increasing the complexity and power consumption of the signal processor or the device in which it is used. It is still further desirable that the circuit and method reduces the required complexity and operating speed of ADCs used therewith.

The present invention provides a solution to these and other problems, and offers further advantages over the prior art.

BRIEF DESCRIPTION OF THE DRAWINGS

These and various other features and advantages of the present invention can be understood more fully from the detailed description that follows and from the accompanying drawings, which however, should not be taken to limit the appended claims to the specific embodiments shown, but are for explanation and understanding only, where:

DETAILED DESCRIPTION

The present invention is directed to a signal processor and processing method for measuring a slope of an analog signal. The method, referred to hereinafter as front-end double sampling, is substantially independent of and unaffected by absolute values of the measured characteristics of the signal.

The circuit for accomplishing front-end double sampling and the method are particularly advantageous for processing signals from a photo-detector, such as a photodiode or other light sensitive element, in a photo-detector array used in an optical navigation system, such as an optical computer mouse or an optical trackball.

For purposes of clarity, many of the details of optical navigation systems in general and signal processing circuits for optical navigation systems in particular that are widely known and are not relevant to the present invention have been omitted from the following description.

The circuit and method will now be described in greater detail with reference to FIGS. 2 to 8.

In the following description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques are not shown in detail or are shown in block diagram form only in order to avoid unnecessarily obscuring an understanding of the invention.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term "to couple" as used herein may include both to directly connect and to indirectly connect through one or more intervening components.

Figure 2:
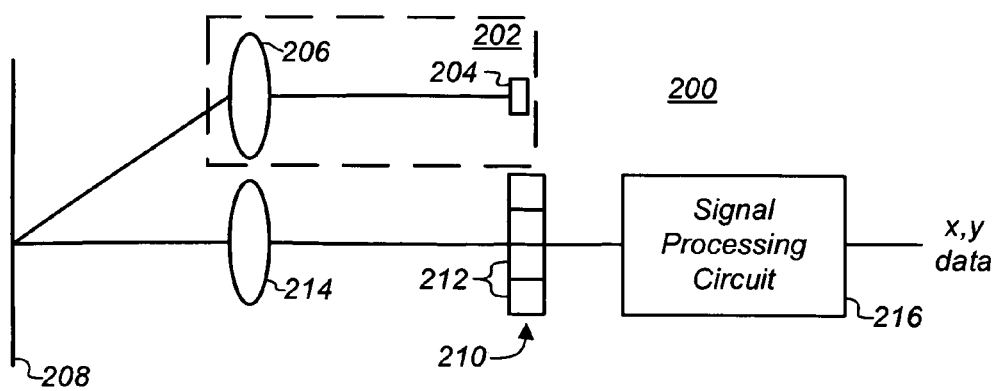
FIG. 2 is a functional block diagram of an optical navigation system having a signal processing circuit according to an embodiment of the present invention.

A functional block diagram of one embodiment of an optical navigation system for which the circuit and method of the present invention is particularly useful is shown in FIG. 2. Generally, the an optical navigation system 200 includes an illuminator 202 having a light source 204 and illumination optics 206 to illuminate a portion of a surface 208, an array 210 having a number of photo-detectors 212, imaging optics 214, and a signal processor or signal processing circuit 216 for combining and processing signals from each one or a combination of the photo-detectors to produce an output signal from the optical navigation system.

Figure 3:
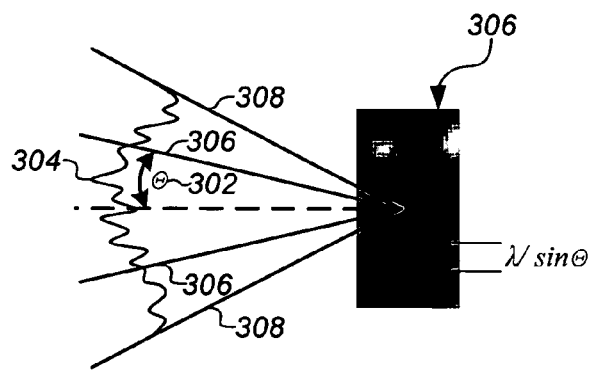
FIG. 3 illustrates speckle in an interference pattern of light reflected from a rough surface.

Preferably, the photo-detectors 212 and signal processing circuit 216 of the optical navigation system 200 are integrally fabricated using a standard semiconductor fabrication processes. More preferably, the optical navigation system 200 is a speckle-based optical navigation system. Most preferably, the optical navigation system 100 is an optically-efficient speckle-based optical navigation system having, for example, structured illumination and telecentric imaging. By speckle it is meant a random intensity distribution of light from a coherent source scattered off of a rough surface to generate an interference pattern known as speckle. Speckle in an interference pattern of light reflected from a rough surface is illustrated in FIG. 3 where angle θ 302 is an angle of incidence with respect to the surface normal of the incident light, 304 is the scattered light, and 306 is the speckle pattern of the reflected or scattered light. Preferably, the main contribution for the speckle measurement comes from rays 306 between normal and angle θ 302, not from the extreme rays 308. Speckle-based optical navigation systems are described, for example, in co-pending, commonly assigned U.S. patent application Ser. No. 11/129,967, entitled, "Optical Positioning Device Having Shaped Illumination," filed on May 16, 2005 by Clinton B. Carlisle et al., and incorporated herein by reference in its entirety.

It has been found that a speckle-based optical navigation system using the signal processing circuit and method of the present invention can meet or exceed all performance criteria typically expected of such systems, including maximum displacement speed, accuracy, and path error rates, while reducing the amount of electrical power dedicated to signal processing and displacement-estimation in the system.

Figure 1:
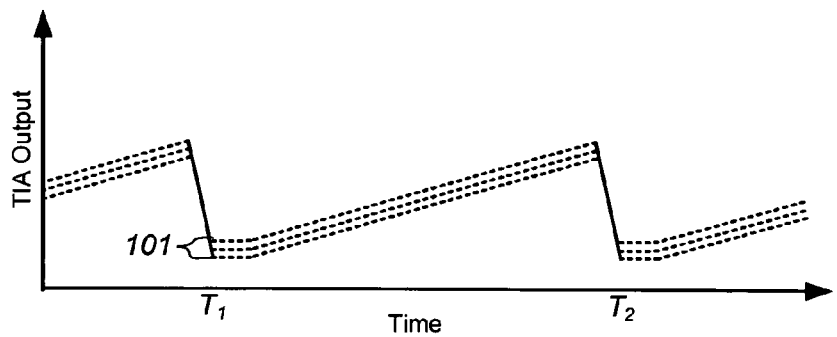
FIG. 1 (Prior Art) is a signal trace illustrating a transimpedance amplifier (TIA) output including changes in an absolute starting value due to reset errors.

Briefly, the signal processing circuit 216 uses or includes one or more a front-end double sampling circuits (not shown in this figure) of the present invention having transimpedance amplifiers (TIAs) with an internal capacitor or capacitors to integrate current from the photo-detectors 212 to create a voltage signal having a ramp or slope proportional to the photo-detector output current. Sample and hold circuits and a differential amplifier in the front-end double sampling circuit are coupled to the output of each TIA to determine the ramp or slope of the voltage signal in a manner substantially independent of absolute values of the signal. That is, the measurement or determination of the signal slope is substantially unaffected by variations in the voltage signal after TIA reset commonly referred to as reset noise 101 and shown in FIG. 1.

Figure 4:
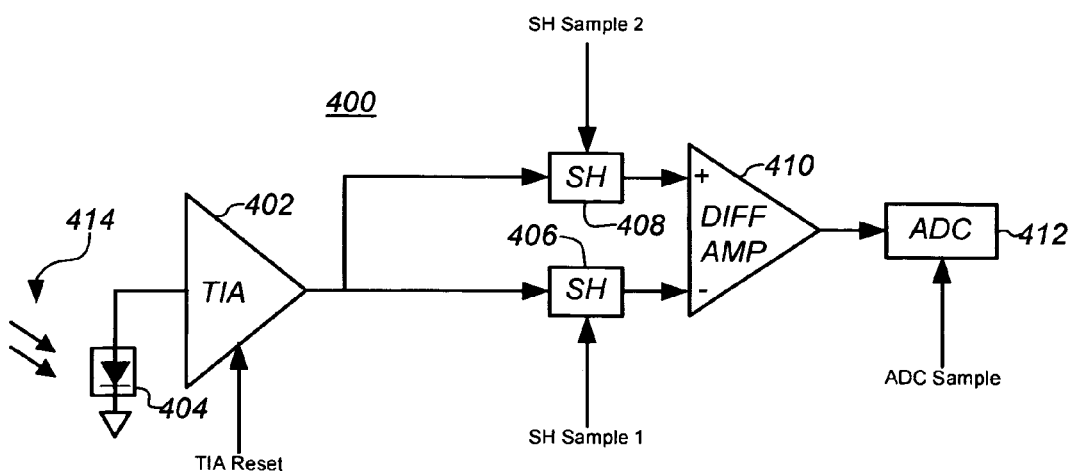
FIG. 4 is a circuit and method for measuring signal slope in an analog front-end of signal processing circuit according to an embodiment of the present invention.

In one embodiment, shown in FIG. 4, the front-end double sampling circuit 400 includes a number TIAs 402 each coupled to one or more photo-detectors 404 in an array of photo-detectors. Coupled in parallel to the output of each TIA 402 is a first sample and hold (S/H) circuit 406, a second S/H circuit 408, and a differential amplifier (DIFF AMP 410). Optionally, as in the embodiment shown, the output of the DIFF AMP 410 feeds the input of an analog-to-digital converter (ADC 412), which yields a digital measurement of the slope of the voltage signal independent of reset noise and DC offset.

Figure 5:
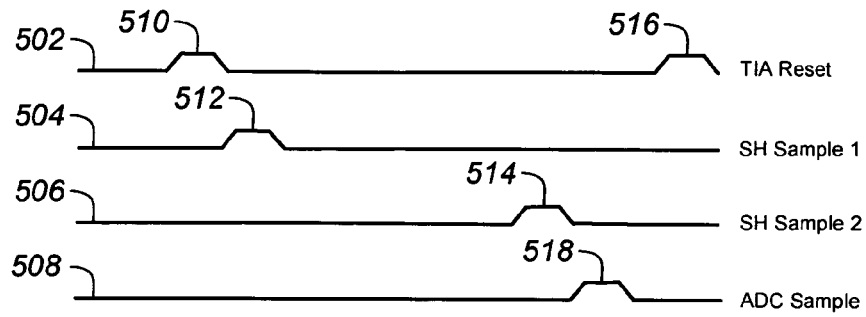
FIG. 5 is a timing diagram illustrating sampling pulses for first and second sample-and-hold (SH) circuits and an analog-to-digital converter (ADC) in relation to TIA reset pulses for the circuit of FIG. 4.

Operation of the front-end double sampling circuit 400 shown in FIG. 4 will now be described with reference to FIGS. 4 and 5. FIG. 5 is a timing diagram illustrating sampling pulses for the first and second S/H circuits 406, 408, and the ADC 412 in relation to reset pulses for the TIA 402. Trace 502 illustrates first and second reset pulses for the TIA 402 of FIG. 4. Traces 504 and 506 illustrate sampling pulses (S/H Sample 1 and S/H Sample 2) for the first and second S/H circuits 406, 408, respectively, and trace 508 illustrates a sampling pulse (ADC Sample) for the ADC 412.

Referring to FIGS. 4 and 5, the TIA 402 is reset or initialized at a first time ($T_1$) by a first TIA reset pulse 510. Light 414 reflected onto the photo-detector 404 produces a current, which is integrated by the TIA 402 to generate a voltage signal ramp or slope proportional to the photo-detector output current. Next, in response to a first sampling pulse 512 the first S/H circuit 406 samples and stores or holds the output of the TIA 402 just after reset or initialization and settling of the analog signal generated by the TIA. In response to a second sampling pulse 514 the second S/H circuit 408 samples and holds the TIA output a given time after the first sample, preferably just before the next TIA reset pulse 516. These two sampled signals are fed into the DIFF AMP 412 to determine the difference between the signals through subtraction. Generally, signal sampled at an earlier time or having a lower value is applied to the inverting input of the DIFF AMP 412. Finally, the ADC Sample pulse 518 is applied to the ADC 412 to provide a digital measurement of the slope of the voltage signal.

Figure 6:
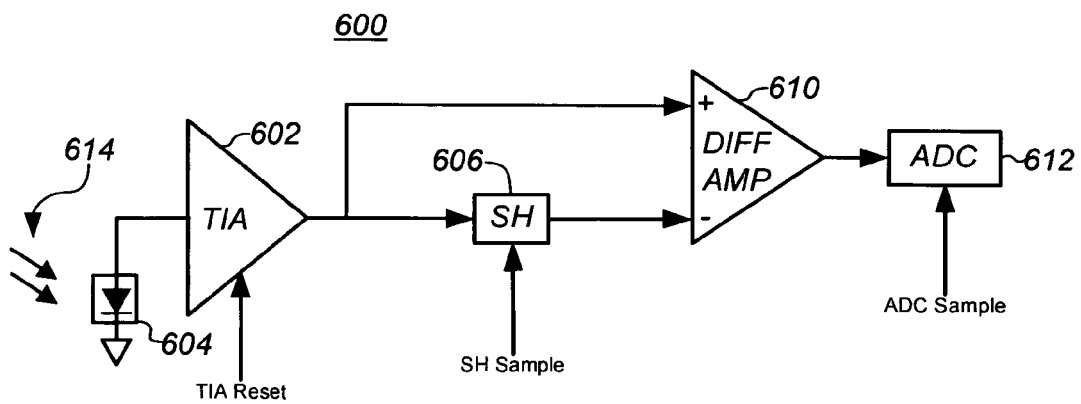
FIG. 6 is a circuit and method for measuring signal slope in an analog front-end of signal processing circuit according to another embodiment of the present invention.

In another embodiment, shown in FIG. 6, the signal processing circuit can be further simplified by eliminating the second S/H circuit and feeding the output of the TIA directly into one side of the differential amplifier. Referring to FIG. 6, the front-end double sampling circuit 600 again includes a number TIAs 602 each coupled to one or more photo-detectors 604. A single S/H circuit 606 is coupled between the output of each TIA 602 and a first input of a DIFF AMP 610. A second DIFF AMP 610 input is coupled directly to the output of the TIA 602 in parallel with the S/H circuit 606. The output of the DIFF AMP 610 feeds the input of the ADC 612 to provide the digital measurement of the slope of the voltage signal. In this embodiment the ADC 612 is triggered before the TIA reset, or at approximately the same time after the second S/H 408 was triggered in the above circuit 400.

Figure 7:
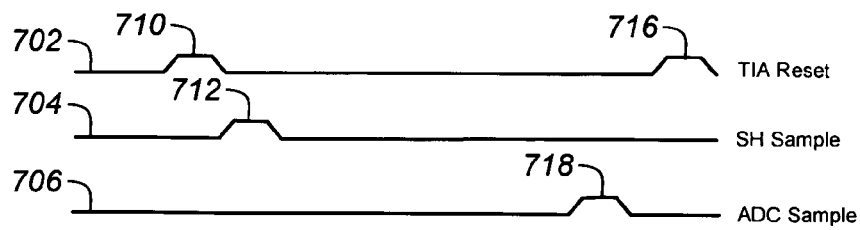
FIG. 7 is a timing diagram illustrating sampling pulses for a S/H circuit and an ADC in relation to TIA reset pulses for the circuit of FIG. 6.

A timing diagram illustrating sampling pulses for the S/H circuit 606 and the ADC 612 in relation to reset pulses for the TIA 602 is shown in FIG. 7. Trace 702 illustrates reset pulses for the TIA 702. Trace 704 illustrates sampling pulses (SH Sample) for the S/H circuit 606, and trace 706 illustrates a sampling pulse (ADC Sample) for the ADC 612.

Referring to FIGS. 6 and 7, the TIA 602 is reset or initialized at a first time ($T_1$) by a first TIA reset pulse 710. Light 614 reflected onto photo-detector 604 produces a current, which is integrated by the TIA 602 to generate a voltage signal having a ramp or slope proportional to the photo-detector output current. Next, in response to a sampling pulse 712 the S/H circuit 606 samples and stores or holds the output of the TIA 602 just after reset or initialization and settling of the analog signal generated by the TIA. The sampled signal is applied to the inverting input of the DIFF AMP 610 while the TIA output is continually applied directly to a second, non-inverting input to determine the difference between the signals through subtraction. Finally, at a predetermined time after the TIA output has been sampled by the S/H circuit 606, preferably just before the next TIA reset pulse 716, an ADC Sample pulse 718 is applied to the ADC 612 to provide a digital measurement of the slope of the voltage signal. Preferably, to avoid additional measurement noise, the ADC Sample pulse 718 is provided a sufficient amount of time before the TIA reset pulse 716 is asserted to enable the ADC 612 to finish sampling the difference between the current output of the TIA 602 and that stored in the S/H circuit 606.

In still another embodiment, not shown, the DIFF AMP and ADC in either of the above circuits can be combined into a single differential ADC with or without amplification.

It will be appreciated that by performing the double sampling in an analog front-end to a digital signal processor (DSP) in a signal processing circuit instead of within the DSP itself, the complexity of the DSP circuitry is significantly reduced. In addition, the DC offset from the TIA output is eliminated by producing a voltage proportional only to the slope of the TIA output. The elimination of the DC offset means that the overall bit width of the ADC can be reduced by using all the ADC resolution to measure only the dynamic range of the slope.

Figure 8:
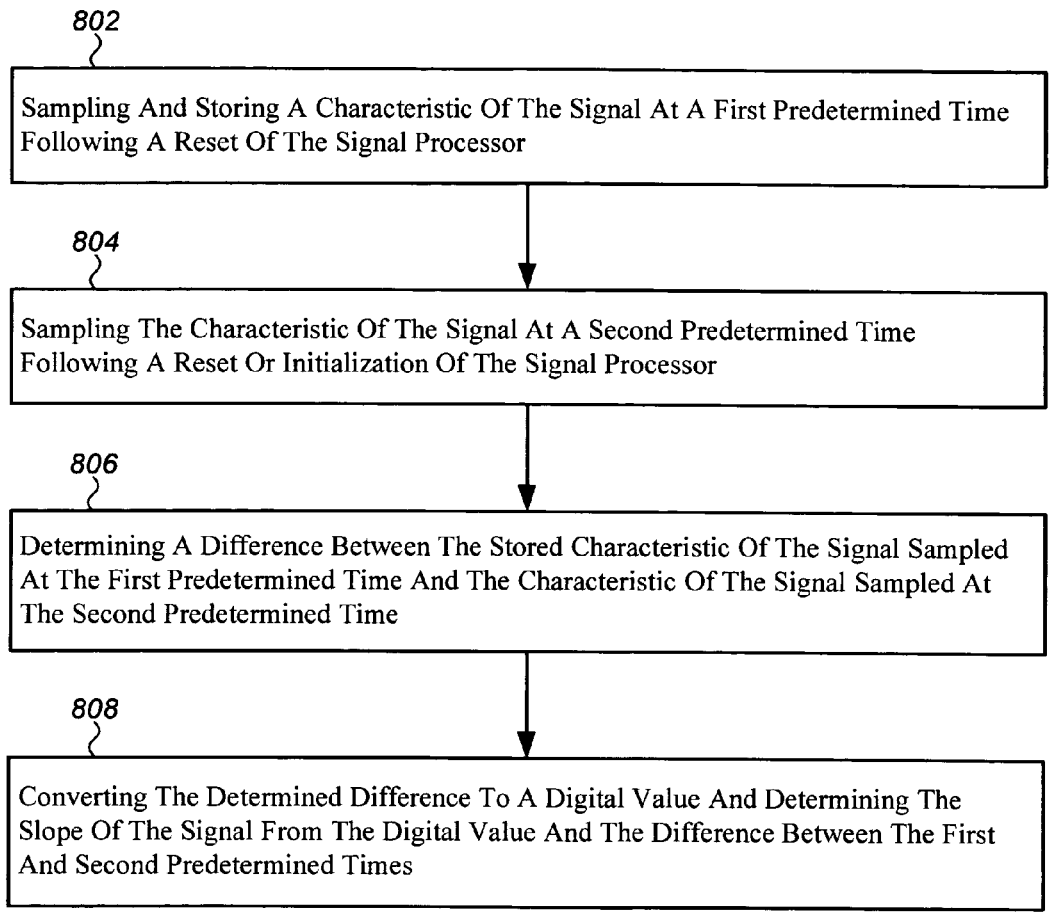
FIG. 8 is a flowchart of a front-end double sampling method according to an embodiment of the present invention.

A front-end double sampling method according to an embodiment of the present invention will now be described in greater detail with reference to the flowchart of FIG. 8. Referring to FIG. 8, the method generally includes steps of: (i) sampling and storing a characteristic of the signal at a first predetermined time following a reset of the signal processor (802); (ii) sampling the characteristic of the signal at a second predetermined time following a reset or initialization of the signal processor (804); (iii) determining a difference between the stored characteristic of the signal sampled at the first predetermined time and the characteristic of the signal sampled at the second predetermined time (806); and (iv) converting the determined difference to a digital value and determining the slope of the signal from the digital value and the difference between the first and second predetermined times (808).

The advantages of the front-end double sampling circuit and method of the present invention over previous or conventional approaches include: (i) avoiding the need for additional DSP circuitry; (ii) eliminating the additional speed requirements on the ADC; and (iii) enabling the ADCs to be simplified by reducing the bit width and measurement range requirements.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents.

What is claimed is:

1. A method of measuring an analog signal from a photo-detector using a signal processing circuit, comprising steps of:
    sampling and storing a characteristic of the signal at a first predetermined time following a reset of the signal processing circuit;
    sampling the characteristic of the signal at a second predetermined time following the first predetermined time;
    determining a difference between the stored characteristic of the signal sampled at the first predetermined time and the characteristic of the signal sampled at the second predetermined time; and
    converting the determined difference to a digital value and determining a slope of the analog signal from the digital value and a known difference between the first and second predetermined times,
    whereby the measurement of the slope of the signal is independent of and substantially unaffected by absolute values of the characteristics measured at the first and second predetermined times.

2. A method according to claim 1, wherein the step of sampling the characteristic of the signal at a second predetermined time comprises the step of sampling and storing the characteristic.

3. A method according to claim 1, wherein the step of determining a difference between the characteristic of the signal sampled at the first and second predetermined times comprises the step of applying the characteristic of the signal sampled at the first and second predetermined times to first and second inputs of a differential amplifier.

4. A method according to claim 3, wherein the step of converting the determined difference to a digital value is accomplished using an analog-to-digital converter (ADC), and wherein the differential amplifier is combined with the ADC.

5. A method according to claim 1, wherein the sampled characteristic of the signal is voltage, and wherein the method further comprises an initial step of integrating a current received from a sensor to generate a voltage signal having a slope that is proportional to the received current.

6. A method according to claim 5, wherein the step of receiving a current from a sensor comprises the step of receiving a current from the photo-detector that generates an electrical current in response to light incident thereon.

7. A signal processing circuit for measuring an analog signal from a sensor in an optical navigation system, the signal processing circuit comprising:
at least a first sample and hold (S/H) circuit coupled to a signal input to sample and hold a characteristic of the signal at a first predetermined time following a reset or initialization of the signal processing circuit; and
a differential amplifier having a first input coupled to an output of the first S/H circuit and a second input coupled to the signal input to determine a difference between the characteristic of the signal stored in the S/H circuit and the characteristic of the signal at a second predetermined time following the first predetermined time,
whereby the measurement of the signal is independent of and substantially unaffected by absolute values of the characteristics measured at the first and second predetermined times.

8. A signal processing circuit according to claim 7 further comprising an analog-to-digital converter (ADC) coupled to an output of the differential amplifier to convert the difference between the characteristic of the signal at the first and second predetermined times to a digital value, from which a slope of the signal is determined.

9. A signal processing circuit according to claim 8, wherein the ADC has an overall bit width selected to measure only a dynamic range of the slope of the voltage signal, thereby increasing resolution of the analog-to-digital conversion.

10. A signal processing circuit according to claim 8, wherein the differential amplifier is combined with the ADC.

11. A signal processing circuit according to claim 8, further comprising a second S/H circuit coupled between the signal input and the second input of the differential amplifier to sample and hold a characteristic of the signal at the second predetermined time.

12. A signal processing circuit according to claim 11, wherein the differential amplifier is combined with the ADC.

13. A signal processing circuit according to claim 7, wherein the measured characteristic of the analog signal is voltage, and wherein the signal processing circuit further comprises a transimpedance amplifier (TIA) to integrate a current received from the sensor to generate a voltage signal having a slope that is proportional to the received current.

14. A signal processing circuit according to claim 13, wherein the sensor is a photosensitive element that generates an electrical current in response to light incident thereon.

15. An optical navigation system for sensing displacement of a data input device relative to a surface, the sensor comprising:
an illuminator to illuminate a portion of the surface;
a plurality of photosensitive elements arranged in a plane parallel to the surface to receive light reflected from the illuminated portion of the surface; and
a signal processing circuit according to claim 14.

16. A method of measuring current received front a photo-detector using a signal processing circuit, comprising steps of:
integrating in a transimpedance amplifier (TIA) the current received from the photo-detector to generate a voltage signal having a slope that is proportional to the received current;
sampling and storing a voltage of the signal at a first predetermined time following a reset of the TIA;
sampling the voltage of the signal at a second predetermined time following the first predetermined time;
determining a difference between the stored voltage of the signal sampled at the first predetermined time and the voltage of the signal sampled at the second predetermined time; and
converting the determined difference to a digital value and determining the slope of the analog signal from the digital value and a known difference between the first and second predetermined times,
whereby the measurement of the slope of the signal is independent of and substantially unaffected by absolute values of the characteristics measured at the first and second predetermined times.

17. A method according to claim 16, wherein the step of sampling the voltage of the signal at a second predetermined time comprises the step of sampling and storing the voltage.

18. A method according to claim 16, wherein the step of determining a difference between the voltage of the signal sampled at the first and second predetermined times comprises the step of applying the voltage of the signal sampled at the first and second predetermined times to first and second inputs of a differential amplifier.

19. A method according to claim 18, wherein the step of converting the determined difference to a digital value is accomplished using an analog-to-digital converter (ADC).

20. A method according to claim 19, wherein the differential amplifier is combined with the ADC.

* * * * *